United States Patent
Liu et al.

(10) Patent No.: US 11,209,469 B2
(45) Date of Patent: Dec. 28, 2021

(54) TIMESTAMP INCONSISTENCY AND SHIFT DETECTION FOR SYNCHROPHASOR DATA BASED ON CORRELATION BETWEEN RELATIVE PHASE ANGLE AND FREQUENCY

(71) Applicant: University of Tennessee Research Foundation, Knoxville, TN (US)

(72) Inventors: Yilu Liu, Knoxville, TN (US); Wenpeng Yu, Knoxville, TN (US); Wenxuan Yao, Knoxville, TN (US)

(73) Assignees: UNIVERSITY OF TENNESSEE RESEARCH FOUNDATION, Knoxville, TN (US); UT-BATTELLE, LLC, Oak Ridge, TN (US)

( * ) Notice: Subject to any disclaimer, the term of this patent is extended or adjusted under 35 U.S.C. 154(b) by 322 days.

(21) Appl. No.: 16/418,540

(22) Filed: May 21, 2019

(65) Prior Publication Data
US 2020/0371143 A1 Nov. 26, 2020

(51) Int. Cl.
*G01R 25/00* (2006.01)
*G01R 19/25* (2006.01)

(52) U.S. Cl.
CPC ......... *G01R 25/00* (2013.01); *G01R 19/2513* (2013.01)

(58) Field of Classification Search
CPC ..... G01R 25/00; G01R 19/2513; G05F 1/625; H03M 1/0626
See application file for complete search history.

(56) References Cited

U.S. PATENT DOCUMENTS

| | | | | |
|---|---|---|---|---|
| 2012/0187770 A1* | 7/2012 | Slota | ...................... | G05F 1/625 307/87 |
| 2013/0154878 A1* | 6/2013 | Guo | ................... | G01R 19/2513 342/357.25 |
| 2013/0285719 A1* | 10/2013 | Ranson | ............... | H03M 1/0626 327/151 |

OTHER PUBLICATIONS

"IEEE Standard for Synchrophasor Measurements for Power Systems" (Year: 2011).*

* cited by examiner

*Primary Examiner* — Regis J Betsch
*Assistant Examiner* — Kaleria Knox
(74) *Attorney, Agent, or Firm* — Myers Bigel, P.A.

(57) ABSTRACT

A method includes performing by a processor: receiving a plurality of synchrophasor measurements of a power system signal associated with a time interval from a phasor measurement unit (PMU), each of the plurality of synchrophasor measurements including a phase angle, frequency value, and a timestamp associated with the synchrophasor measurement, determining a plurality of relative phase angles based on the plurality of phase angles, determining a correlation coefficient between the plurality of relative phase angles and a plurality of corresponding frequency values of the power system signal, and detecting an error in the plurality of timestamps based on the correlation coefficient; estimating the error in the plurality of timestamps based on the plurality of relative phase angles and the plurality of corresponding frequency values.

16 Claims, 8 Drawing Sheets

TIMESTAMP INCONSISTENCY AND SHIFT DETECTION FOR SYNCHROPHASOR DATA BASED ON CORRELATION BETWEEN RELATIVE PHASE ANGLE AND FREQUENCY

STATEMENT REGARDING FEDERALLY SPONSORED RESEARCH OR DEVELOPMENT

This invention was made with government support under contract number NSF EEC1041877 awarded by the National Science Foundation. The government has certain rights in the invention.

BACKGROUND

The present disclosure relates to power systems, and, in particular, to monitoring, operation, and control of power systems.

Phasor Measurement Units (PMUs) are devices that are used to estimate the magnitude and phase angle of the voltage or current in a power system using a common time source for synchronization. PMUs are increasingly deployed in power systems in to provide synchronized measurements for system situational awareness and observation of behavioral dynamics. The PMUs may be placed in various locations within a power system including the main power grid, the distribution grid, and/or consumer locations. PMUs may be used to collect samples from a waveform in quick succession and to reconstruct the phasor quantity, which is made up of an angle measurement and a magnitude measurement known as a synchrophasor measurement.

The frequency of a power system may be affected by the balance between power generation and load consumption. Power consumption and/or power generation may both vary, which may result in the two rarely being precisely in balance. During normal operation, changes in frequency may be controlled by ancillary services that provide continuous, automatic frequency control through automatic generator control (AGC). However, severe electromechanical disturbances, such as generation trip and load reduction, can cause significant drops and/or increases in system frequency and may influence the dynamic behavior of a power grid. Therefore, it is generally desirable to prevent and/or reduce large deviations of the power system frequency from the nominal frequency during large disturbances so as to improve the operational stability of power systems. The synchrophasor measurements from the PMUs may be used to detect events in the power system that may cause deviations in power system frequency from the nominal frequency range or other potential problems or malfunctions in the power system.

A power system may use the Global Positioning System (GPS) to align synchrophasor data that has been collected from various PMUs for analysis. A Phasor Data Concentrator (PDC) may rely on timestamps attached to each synchrophasor measurement. The PMUs receive the time information from the GPS and include this information with the synchrophasor measurement when transmitting the measurement to the PDC. Normally the synchrophasor measurements are timestamped with a margin of error of approximately 100 nanoseconds under good GPS reception conditions. However, phasor calculation may use data from a time window of one to two 60 Hz cycles and different vendors may use different approaches to assign the calculated value from the beginning to the end of the time window. This inconsistency may introduce time synchronization errors. Although Pulse Per Second (PPS) from a GPS receiver can be accurate to within a few nanoseconds, the GPS time serial output may have a much larger latency, which can be as large as a half-second. Improper handling of the latency may enlarge the time synchronization errors. Other uncontrollable and unpredictable factors, such as temporal hardware malfunctions may result in imperfect synchronization and time skew between the PMU synchrophasor measurements even after the PMUs have been calibrated. In addition, events such as leap years or GPS rollover, i.e., the reset in the field used to hold the week number from its maximum number periodically to zero, may also cause synchronization errors. The timestamp time shift or skew in the synchrophasor measurement data may adversely affect power system operations that may rely on a high level of synchrophasor measurement synchronization, such as, power system protection, fault location, oscillation detection, and event triangulation. Because the timestamp time shift in the synchrophasor measurement data from the PMUs may be relatively small, e.g., less than one second, the shift may be difficult to detect.

SUMMARY

In some embodiments of the inventive concept, a method comprises performing by a processor: receiving a plurality of synchrophasor measurements of a power system signal associated with a time interval from a phasor measurement unit (PMU), each of the plurality of synchrophasor measurements including a phase angle, frequency value, and a timestamp associated with the synchrophasor measurement, determining a plurality of relative phase angles based on the plurality of phase angles, determining a correlation coefficient between the plurality of relative phase angles and a plurality of corresponding frequency values of the power system signal, and detecting an error in the plurality of timestamps based on the correlation coefficient; estimating the error in the plurality of timestamps based on the plurality of relative phase angles and the plurality of corresponding frequency values.

In other embodiments, the method further comprises adjusting the plurality of timestamps of the plurality of synchrophasor measurements received from the PMU based on the error.

In still other embodiments, the plurality of synchrophasor measurements is a first plurality of synchrophasor measurements, the plurality of phase angles is a first plurality of phase angles, the plurality of timestamps is a first plurality of timestamps, and the time interval is a first time interval, the method further comprising: receiving a second plurality of synchrophasor measurements of the power system signal associated with a second time interval from the PMU, each of the second plurality of synchrophasor measurements including a second phase angle and a second timestamp associated with the synchrophasor measurement and adjusting the second plurality of timestamps associated with the second plurality of synchrophasor measurements received from the PMU based on the error.

In still other embodiments, the method further comprises performing an administrative operation on the power system based on the plurality of synchrophasor measurements having the plurality of timestamps, respectively, that have been adjusted.

In still other embodiments, determining the plurality of relative phase angles based on the plurality of phase angles comprises: subtracting a power system average phase angle or a phase angle of a reference PMU from each of the plurality of phase angles to obtain the plurality of relative phase angles.

In still other embodiments, determining the correlation coefficient between the plurality of relative phase angles and the plurality of corresponding frequency values of the power system signal comprises: determining a covariance between the plurality of relative phase angles and the plurality of corresponding frequency values, determining a standard deviation of the plurality of relative phase angles, determining a standard deviation of the plurality of corresponding frequency values, and dividing the covariance by a product of the standard deviation of the plurality of relative phase angles and the standard deviation of the plurality of corresponding frequency values.

In still other embodiments, detecting the error in the plurality of timestamps based on the correlation coefficient comprises: comparing the correlation coefficient to a threshold and detecting the error in the plurality of timestamps based on a difference between the correlation coefficient and the threshold.

In still other embodiments, estimating the error in the plurality of timestamps based on the plurality of relative phase angles and the plurality of corresponding frequency values comprises: determining a relative phase angle difference between a maximum relative phase angle value of the plurality of relative phase angles and a minimum relative phase angle value of the plurality of relative phase angles, determining a frequency difference between the frequency value at a time of a maximum relative phase angle and the frequency value at a time of a minimum relative phase angle, and estimating the error in the plurality of timestamps based on the .relative phase angle difference divided by a product of the frequency difference and $2\pi$.

In still other embodiments, the plurality of synchrophasor measurements is a first plurality of synchrophasor measurements, the plurality of phase angles is a first plurality of phase angles, the plurality of timestamps is a first plurality of timestamps, the time interval is a first time interval, the plurality of relative phase angles is a first plurality of relative phase angles, and the correlation coefficient is a first correlation coefficient, the method further comprising: receiving a second plurality of synchrophasor measurements of the power system signal associated with a second time interval from the PMU, each of the second plurality of synchrophasor measurements including a second phase angle and a second timestamp associated with the synchrophasor measurement, determining a second plurality of relative phase angles based on the second plurality of phase angles, determining a second correlation coefficient between the second plurality of relative phase angles and a second plurality of corresponding frequency values of the power system signal, and determining an average of the first correlation coefficient and the second correlation coefficient.

In still other embodiments, detecting the error in the first plurality of timestamps based on the correlation coefficient comprises: detecting the error in the first plurality of timestamps and the second plurality of timestamps based on the average of the first correlation coefficient and the second correlation coefficient. Estimating the error in the first plurality of timestamps based on the first plurality of relative phase angles and the first plurality of corresponding frequency values comprises: estimating the error in the first plurality of timestamps and the second plurality of timestamps based on the first plurality of relative phase angles, the second plurality of relative phase angles, the first plurality of corresponding frequency values, and the second plurality of corresponding frequency values.

In some embodiments of the inventive concept, a system comprises a processor and a memory coupled to the processor and comprising computer readable program code embodied in the memory that is executable by the processor to perform operations comprising: receiving a plurality of synchrophasor measurements of a power system signal associated with a time interval from a phasor measurement unit (PMU), each of the plurality of synchrophasor measurements including a phase angle, frequency value, and a timestamp associated with the synchrophasor measurement, determining a plurality of relative phase angles based on the plurality of phase angles, determining a correlation coefficient between the plurality of relative phase angles and a plurality of corresponding frequency values of the power system signal, detecting an error in the plurality of timestamps based on the correlation coefficient, and estimating the error in the plurality of timestamps based on the plurality of relative phase angles and the plurality of corresponding frequency values.

In further embodiments, the operations further comprise: adjusting the plurality of timestamps of the plurality of synchrophasor measurements received from the PMU based on the error.

In still further embodiments, determining the correlation coefficient between the plurality of relative phase angles and the plurality of corresponding frequency values of the power system signal comprises: determining a covariance between the plurality of relative phase angles and the plurality of corresponding frequency values, determining a standard deviation of the plurality of relative phase angles, determining a standard deviation of the plurality of corresponding frequency values, and dividing the covariance by a product of the standard deviation of the plurality of relative phase angles and the standard deviation of the plurality of corresponding frequency values.

In still further embodiments, detecting the error in the plurality of timestamps based on the correlation coefficient comprises: comparing the correlation coefficient to a threshold and detecting the error in the plurality of timestamps based on a difference between the correlation coefficient and the threshold.

In still further embodiments, estimating the error in the plurality of timestamps based on the plurality of relative phase angles and the plurality of corresponding frequency values comprises: determining a relative phase angle difference between a maximum relative phase angle value of the plurality of relative phase angles and a minimum relative phase angle value of the plurality of relative phase angles, determining a frequency difference between the frequency value at a time of a maximum relative phase angle and the frequency value at a time of a minimum relative phase angle, and estimating the error in the plurality of timestamps based on the .relative phase angle difference divided by a product of the frequency difference and $2\pi$.

In some embodiments of the inventive concept, a computer program product comprises a tangible computer readable storage medium comprising computer readable program code embodied in the medium that is executable by a processor to perform operations comprising: receiving a plurality of synchrophasor measurements of a power system signal associated with a time interval from a phasor measurement unit (PMU), each of the plurality of synchrophasor measurements including a phase angle, frequency value, and a timestamp associated with the synchrophasor measurement, determining a plurality of relative phase angles based on the plurality of phase angles, determining a correlation coefficient between the plurality of relative phase angles and a plurality of corresponding frequency values of the power system signal, detecting an error in the plurality of timestamps based on the correlation coefficient, and estimating the error in the plurality of timestamps based on the plurality of relative phase angles and the plurality of corresponding frequency values.

In other embodiments, the operations further comprise: adjusting the plurality of timestamps of the plurality of synchrophasor measurements received from the PMU based on the error.

In still other embodiments, determining the correlation coefficient between the plurality of relative phase angles and the plurality of corresponding frequency values of the power system signal comprises: determining a covariance between the plurality of relative phase angles and the plurality of corresponding frequency values, determining a standard deviation of the plurality of relative phase angles, determining a standard deviation of the plurality of corresponding frequency values, and dividing the covariance by a product of the standard deviation of the plurality of relative phase angles and the standard deviation of the plurality of corresponding frequency values.

In still other embodiments, detecting the error in the plurality of timestamps based on the correlation coefficient comprises: comparing the correlation coefficient to a threshold and detecting the error in the plurality of timestamps based on a difference between the correlation coefficient and the threshold.

In still other embodiments, estimating the error in the plurality of timestamps based on the plurality of relative phase angles and the plurality of corresponding frequency values comprises: determining a relative phase angle difference between a maximum relative phase angle value of the plurality of relative phase angles and a minimum relative phase angle value of the plurality of relative phase angles, determining a frequency difference between the frequency value at a time of a maximum relative phase angle and the frequency value at a time of a minimum relative phase angle, and estimating the error in the plurality of timestamps based on the .relative phase angle difference divided by a product of the frequency difference and $2\pi$.

Other methods, systems, articles of manufacture, and/or computer program products, according to embodiments of the inventive concept, will be or become apparent to one with skill in the art upon review of the following drawings and detailed description. It is intended that all such additional systems, methods, articles of manufacture, and/or computer program products be included within this description, be within the scope of the present inventive concept, and be protected by the accompanying claims.

BRIEF DESCRIPTION OF THE DRAWINGS

Other features of embodiments will be more readily understood from the following detailed description of specific embodiments thereof when read in conjunction with the accompanying drawings, in which.

DETAILED DESCRIPTION

In the following detailed description, numerous specific details are set forth to provide a thorough understanding of embodiments of the present disclosure. However, it will be understood by those skilled in the art that the present invention may be practiced without these specific details. In some instances, well-known methods, procedures, components and circuits have not been described in detail so as not to obscure the present disclosure. It is intended that all embodiments disclosed herein can be implemented separately or combined in any way and/or combination. Aspects described with respect to one embodiment may be incorporated in different embodiments although not specifically described relative thereto. That is, all embodiments and/or features of any embodiments can be combined in any way and/or combination.

As used herein, the term "data processing facility" includes, but it is not limited to, a hardware element, firmware component, and/or software component. A data processing system may be configured with one or more data processing facilities.

As used herein, the term "real-time" may mean an operation is performed without inserting any artificial scheduling or processing delays.

Some embodiments of the inventive concept may stem from a realization that that when a time shift or skew occurs in timestamps for Phasor Measurement Unit (PMU) synchrophasor measurement data, the relative phase angle and frequency of the power signal obtained through the synchrophasor data are correlated. In a relative short time interval, the relative phase angle, which varies with power flow between areas, may be considered a stochastic process. The time shift or skew in the timestamps of the synchrophasor measurement data may introduce a component into the relative phase angle that has a linear relationship with frequency. This similarity or correlation between the relative phase angle and frequency may be used as an indicator for detecting whether a time shift or skew has occurred in the timestamps for the synchrophasor measurement data generated by a PMU. In other words, if the relative phase angle is determined to be similar or have a generally high correlation with frequency, then the synchrophasor measurement data generated by a PMU may include time shifted timestamps.

Figure 1:
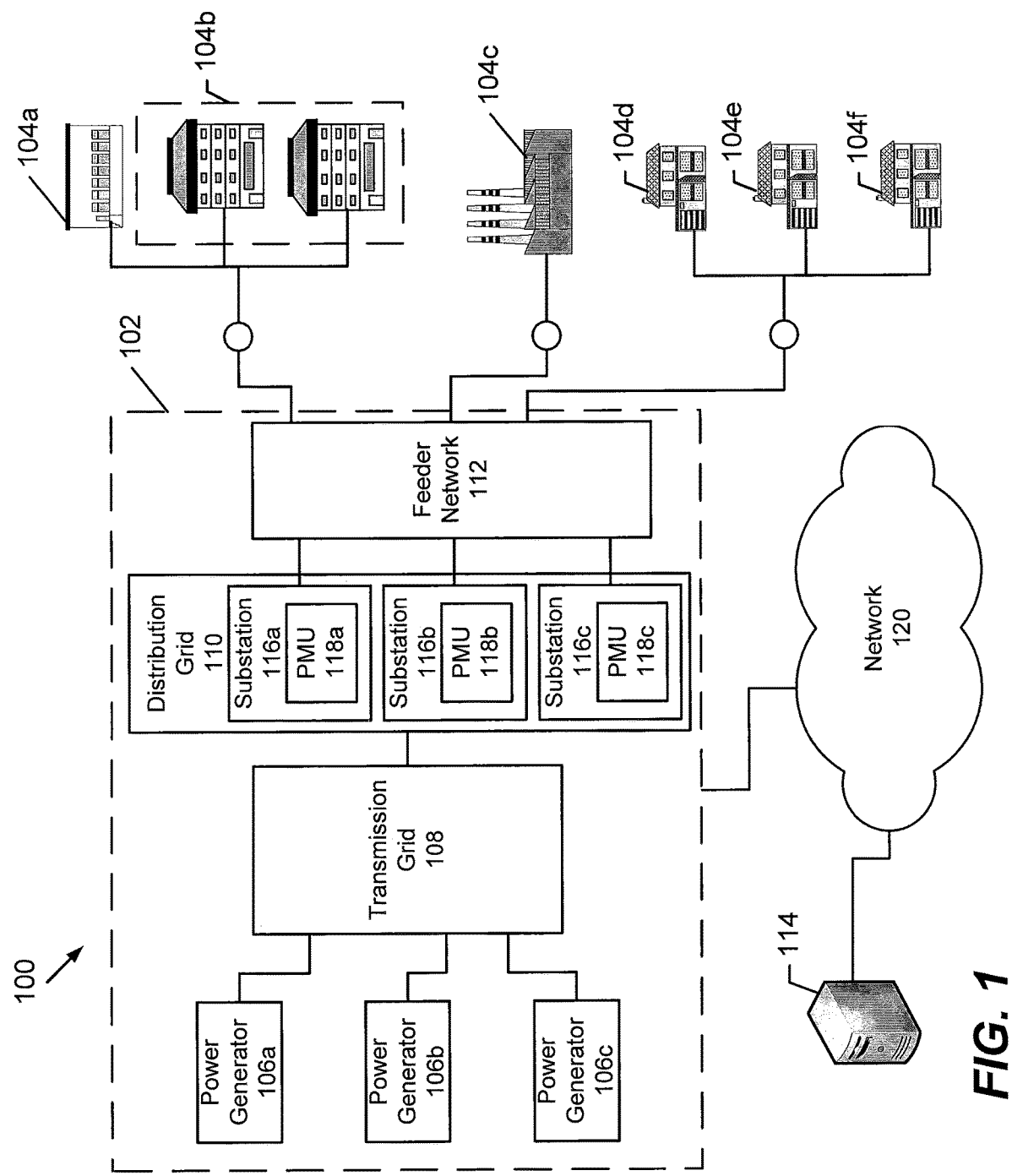
FIG. 1 is a block diagram that illustrates a power distribution network including a synchrophasor measurement timestamp time shift detection capability in accordance with some embodiments of the inventive concept.

Referring to FIG. 1, a power system distribution network 100 including a synchrophasor measurement timestamp time shift detection capability, in accordance with some embodiments of the inventive concept, comprises a main power grid 102, which is typically operated by a public or private utility, and which provides power to various power consumers 104a, 104b, 104c, 104d, 104e, and 104f. The electrical power generators 106a, 106b, and 106c are typically located near a fuel source, at a dam site, and/or at a site often remote from heavily populated areas. The power generators 106a, 106b, and 106c may be nuclear reactors, coal burning plants, hydroelectric plants, and/or other suitable facility for generating bulk electrical power. The power output from the power generators 106, 106b, and 106c is carried via a transmission grid or transmission network over potentially long distances at relatively high voltage levels. A distribution grid 110 may comprise multiple substations 116a, 116b, 116c, which receive the power from the transmission grid 108 and step the power down to a lower voltage level for further distribution. A feeder network 112 distributes the power from the distribution grid 110 substations 116a, 116b, 116c to the power consumers 104a, 104b, 104c, 104d, 104e, and 104f. The power substations 116a, 116b, 116c in the distribution grid 110 may step down the voltage level when providing the power to the power consumers 104a, 104b, 104c, 104d, 104e, and 104f through the feeder network 112.

As shown in FIG. 1, the power consumers 104a, 104b, 104c, 104d, 104e, and 104f may include a variety of types of facilities including, but not limited to, a warehouse 104a, a multi-building office complex 104b, a factory 104c, and residential homes 104d, 104e, and 104f. A feeder circuit may connect a single facility to the main power grid 102 as in the case of the factory 104c or multiple facilities to the main power grid 102 as in the case of the warehouse 104a and office complex 104b and also residential homes 104d, 104e, and 104f. Although only six power consumers are shown in FIG. 1, it will be understood that a feeder network 112 may service hundreds or thousands of power consumers.

The power distribution network 100 further comprises a Distribution Management System (DMS) 114, which may monitor and control the generation and distribution of power via the main power grid 102. The DMS 114 may comprise a collection of processors and/or servers operating in various portions of the main power grid 102 to enable operating personnel to monitor and control the main power grid 102. The DMS 114 may further include other monitoring and/or management systems for use in supervising the main power grid 102. One such system is known as the Supervisory Control and Data Acquisition (SCADA) system, which is a control system architecture that uses computers, networked data communications, and graphical user interfaces for high-level process supervisory management of the main power grid. The DMS 114 may further include a phasor data concentrator module that is configured to manage the reception and processing of synchrophasor measurements from the PMUs 118a, 118b, and 118c. The phasor data concentrator module may cooperate with other supervisory, monitoring, and control modules, systems, and/or capabilities provided via the DMS 114

According to some embodiments of the inventive concept, PMUs 118a, 118b, and 118c may be located at the substations 116a, 116b, and 116c, respectively. PMUs measure current and voltage by amplitude and phase at selected stations of the distribution grid 110. Using Global Positioning System (GPS) information, for example, high-precision time synchronization may allow comparing measured values (synchrophasors) from different substations distant to each other and drawing conclusions regarding the system state and dynamic events, such as power swing conditions. The PMUs 118a, 118b, 118c may determine current and voltage phasors, frequency, and rate of change of frequency and provide these measurements with time stamps for transmittal to the DMS 114 for analysis. The PMUs 118a, 118b, 118c may communicate with the DMS 114 over the network 120. The network 120 may be a global network, such as the Internet or other publicly accessible network. Various elements of the network 120 may be interconnected by a wide area network, a local area network, an Intranet, and/or other private network, which may not be accessible by the general public. Thus, the communication network 120 may represent a combination of public and private networks or a virtual private network (VPN). The network 120 may be a wireless network, a wireline network, or may be a combination of both wireless and wireline networks. Although the PMUs 118a, 118b, and 118c are shown as being located in the substations 116a, 116b, and 116c, it will be understood that the PMUs may be located in other locations within the distribution grid 110, within the main power grid 102, or even at consumer locations 104a, 104b, 104c, 104d, 104e, and 104f, such as, for example, in proximity to wall outlets or other power access points.

Although FIG. 1 illustrates an exemplary a power distribution network 100 including a synchrophasor measurement timestamp time shift detection capability, it will be understood that embodiments of the inventive concept are not limited to such configurations, but are intended to encompass any configuration capable of carrying out the operations described herein.

Figure 2:
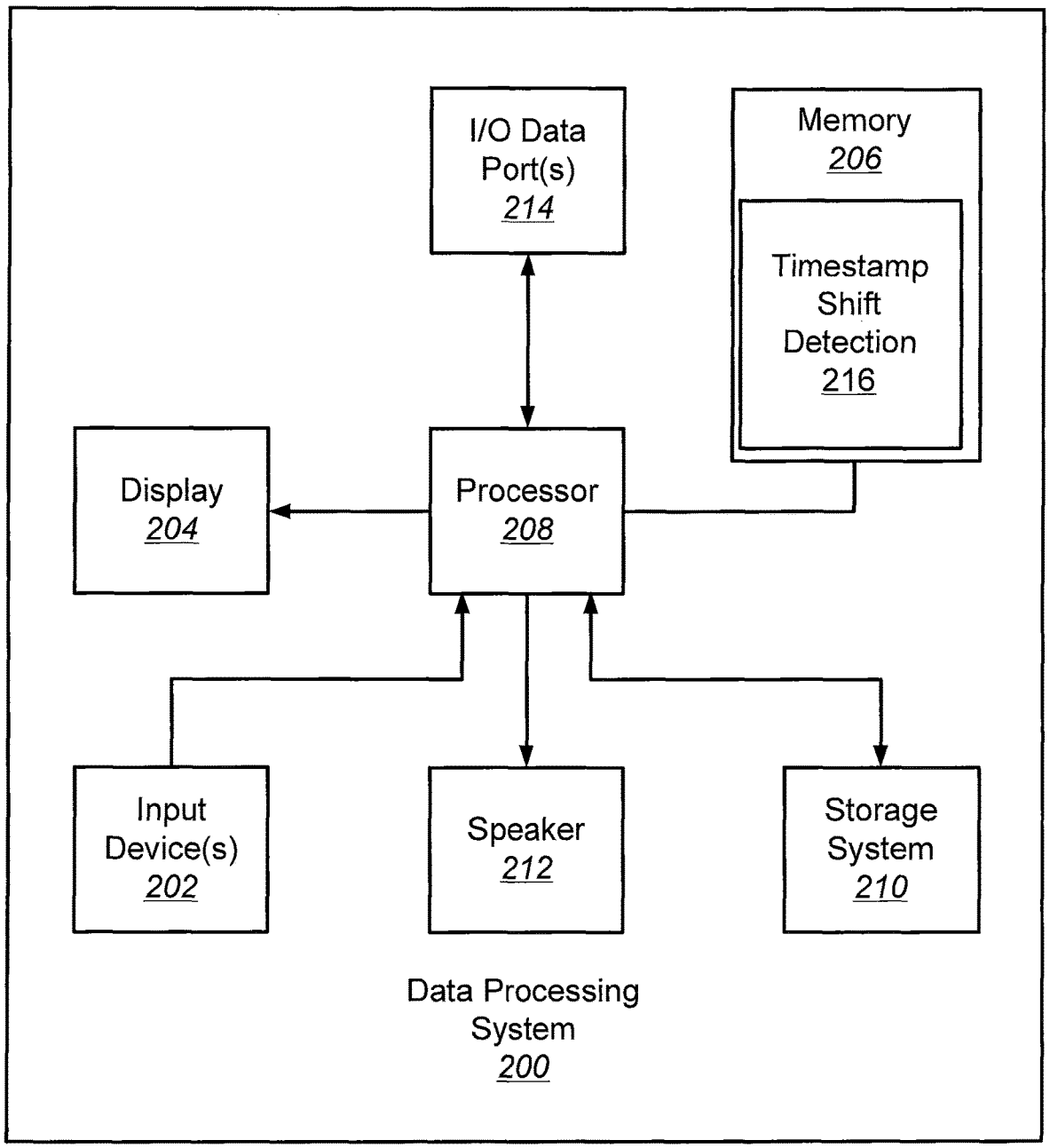
FIG. 2 illustrates a data processing system that may be used to implement a Distribution Management System (DMS) processor associated with a power system of FIG. 1 in accordance with some embodiments of the inventive concept.

Referring now to FIG. 2, a data processing system 200 that may be used to implement the DMS 114 processor of FIG. 1, in accordance with some embodiments of the inventive concept, comprises input device(s) 202, such as a keyboard or keypad, a display 204, and a memory 206 that communicate with a processor 208. The data processing system 200 may further include a storage system 210, a speaker 212, and an input/output (I/O) data port(s) 214 that also communicate with the processor 208. The storage system 210 may include removable and/or fixed media, such as floppy disks, ZIP drives, hard disks, or the like, as well as virtual storage, such as a RAMDISK. The I/O data port(s) 214 may be used to transfer information between the data processing system 200 and another computer system or a network (e.g., the Internet). These components may be conventional components, such as those used in many conventional computing devices, and their functionality, with respect to conventional operations, is generally known to those skilled in the art. The memory 206 may be configured with sustained oscillation detection module 216 that may provide functionality that may include, but is not limited to, detecting time shifts in timestamps for synchrophasor measurements obtained from one or more PMUs 118a, 118b, and 118c in accordance with some embodiments of the inventive concept.

Figure 3:
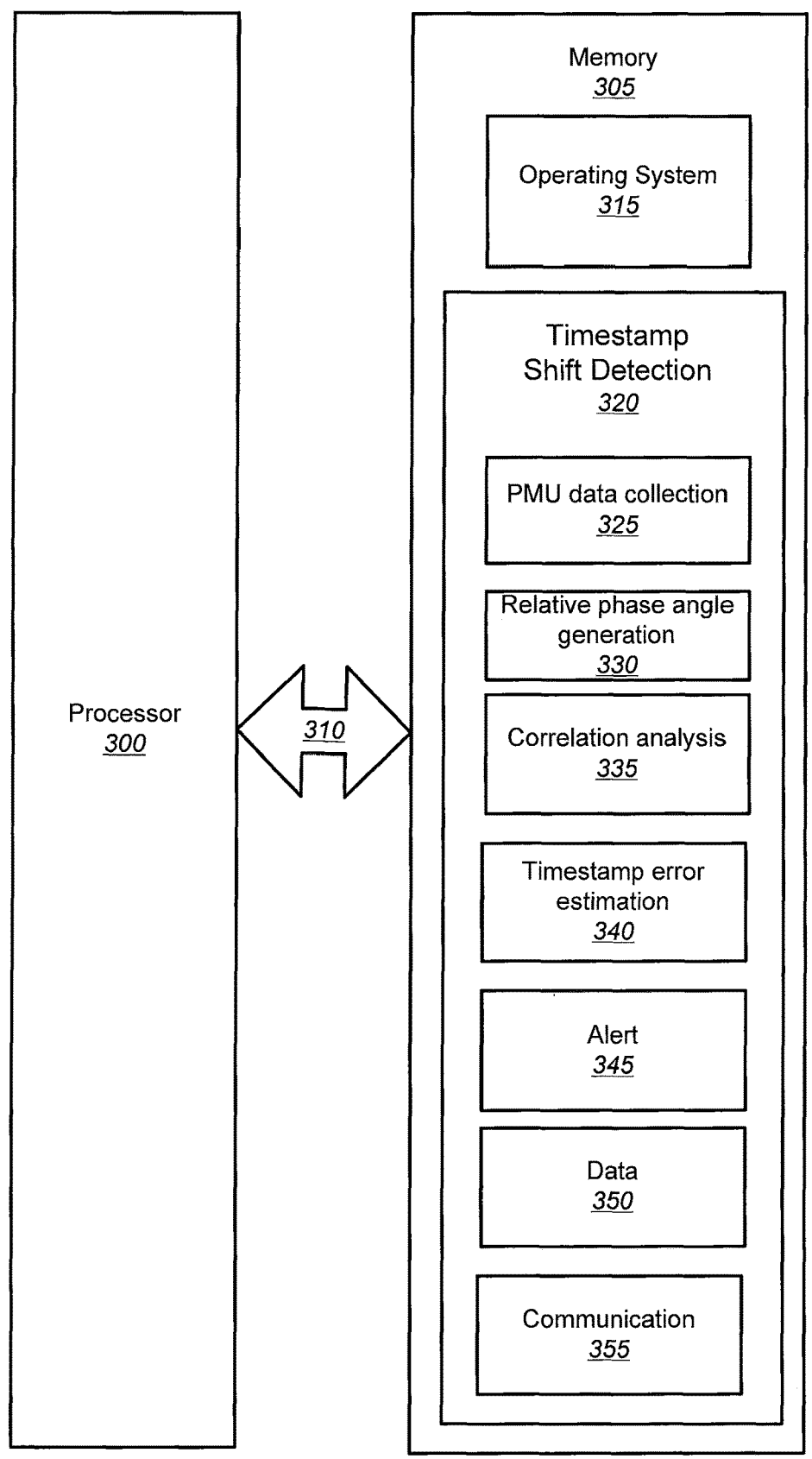
FIG. 3 is a block diagram that illustrates a software/hardware architecture for use in a DMS processor for detecting synchrophasor measurement timestamp time shifts in a power system in accordance with some embodiments of the inventive concept.

FIG. 3 illustrates a processor 300 and memory 305 that may be used in embodiments of data processing systems, such as the DMS 114 processor of FIG. 1 and the data processing system 200 of FIG. 2, respectively, for detecting synchrophasor measurement timestamp time shifts, in accordance with some embodiments of the inventive concept. The processor 300 communicates with the memory 305 via an address/data bus 310. The processor 300 may be, for example, a commercially available or custom microprocessor. The memory 305 is representative of the one or more memory devices containing the software and data used for detecting synchrophasor measurement timestamp time shifts in accordance with some embodiments of the inventive concept. The memory 305 may include, but is not limited to, the following types of devices: cache, ROM, PROM, EPROM, EEPROM, flash, SRAM, and DRAM.

As shown in FIG. 3, the memory 305 may contain two or more categories of software and/or data: an operating system 315 and a timestamp time shift detection module 320. In particular, the operating system 315 may manage the data processing system's software and/or hardware resources and may coordinate execution of programs by the processor 300. The timestamp time shift detection module 320 may comprise a PMU data collection module 325, a relative phase angle generation module 330, a correlation analysis module 335, a timestamp error estimation module 340, an alert module 345, a data module 350, and a communication module 355.

The PMU data collection module 325 may be configured to receive measured information, such as, for example, time-stamped power system synchrophasor measurements from the PMUs 118a, 118b, and 118c in the distribution grid 110. Each of the synchrophasor measurements of a power system signal may include a phase angle, frequency value, and a timestamp associated with the synchrophasor measurement.

The relative phase angle generation module 330 may be configured to determine relative phase angles from the phase angle data in the synchrophasor measurements obtained from the PMUs 118a, 118b, and 118c. The real phase angle of the complex voltage/current signal changes at the rate of $2\pi f$ while the reported phase angle from the PMUs 118a, 118b, and 118c is the instant angle value at the reporting time, where f is the frequency of the measured signal. The deviation of phase angle $\Delta A$ can be derived as EQ. (1), where $f_N$ is the nominal frequency, e.g. 50 Hz or 60 Hz.

$$\Delta A = 2\pi f(f - f_N) \cdot dt \quad (1)$$

Relative phase angle $A_{rel}$ is defined as Eq. (2), $$A_{rel}(T) = A(T) - A_{ref}(T) \quad (2)$$

where A is the measured phase angle and $A_{ref}$ is a reference phase angle, which, in some embodiments, may be a power system average phase angle.

The relative phase angle generation module may be further configured to determine the variation of relative phase angle during a defined time interval. Combining EQ. 1 and 2 and defining $\Delta t$ as a PMU's 118a, 118b, and 118c reporting interval, the variation of relative phase angle during the interval $\Delta t$ can be derived:

$$\Delta A_{rel}(T) = \Delta A(T) - \Delta A_{ref}(T) \quad (3)$$

$$= 2\pi \int_{T-\Delta t}^{T} (f - f_{ref}) \cdot dt$$

$$\stackrel{\Delta}{=} 2\pi \cdot (f - f_{ref}) \cdot \Delta t$$

Because relative phase angle varies with power flow among areas, the relative phase angle and its variation may also be considered a stochastic process. For example, when multiple PMUs 118a, 118b, and 118c are deployed in a synchronized power grid, and one individual PMU 118a, 118b, and 118c has timestamp time shift in its synchrophasor measurements, the inaccurate time T' may be defined as set forth in EQ. (4):

$$T' = T + \tau \quad (4)$$

where T is the accurate time and $\tau$ is the time shift value.

Based on the time shifted synchrophasor measurement, the corresponding relative phase angle variation can be calculated as set forth in Equations (5) and (6)"

$$\Delta A_{rel}(T') = 2\pi \cdot [f(T') - f_{ref}(T)] \cdot \Delta t \quad (5)$$

$$= 2\pi \cdot [f(T) + \Delta f_\tau(T) - f_{ref}(T)] \cdot \Delta t$$

$$= \Delta A_{ref}(T) + 2\pi \cdot \Delta f_\tau(T) \cdot \Delta t$$

where $\Delta f_\tau(T)$ is frequency variation between time T' and T. Then Eq. (6) can be derived from the integral of Eq. (5):

$$A_{rel}(T') \approx A_{rel}(T) + \underbrace{f(T) \cdot 2\pi \cdot \tau + C}_{D} \quad (6)$$

where $A_{rel}(T')$ is the relative phase angle with a time shift, $A_{rel}(T)$ is the true relative phase angle, and C is a constant.

As described above, $A_{rel}(T)$ may be considered as a stochastic component. However, the remaining part of the right side "D" of EQ. (6) is a component that is linear with respect to frequency. Therefor a time shift in the timestamps associated with synchrophasor measurements from a PMU 118a, 118b, and 118c may be detected when a similarity component that is linear with respect to frequency is found in $A_{rel}(T')$. In other words, when a correlation, such as a linear relationship, is found between relative phase angles associated with synchrophasor measurements and the frequency of the power signal from which the measurements were derived over a time interval, then this correlation may be indicative of a time shift in the timestamps associated with the synchrophasor measurements.

The correlation analysis module 335 may be configured to quantify the similarity or relationship between the relative phase angles associated with the synchrophasor measurements and the frequency of the power signal. In some embodiments, this quantification may take the form of a determination of a correlation coefficient between the relative phase angle $A_{rel}$ and frequency f as set forth in EQ. 7:

$$\rho_{A_{rel}, f} = \frac{\text{cov}(A_{rel}, f)}{\sigma_{A_{rel}} \sigma_f} \quad (7)$$

where cov(.) and $\sigma$ represent the covariance and standard deviation functions, respectively.

In some embodiments, when $\rho_{A_{rel}, f}$ exceeds a threshold $\varepsilon$, a time shift in the timestamps associated with synchrophasor measurements obtained from a PMU 118a, 118b, and 118c may be detected, where $\varepsilon$ may be empirically selected via simulation study using historical ambient synchrophasor data with the introduction of artificial time shifts in the synchrophasor measurement data.

The timestamp error estimation module 340 may be configured to estimate the error, i.e., the amount of shift, in the time shifted timestamps of the synchrophasor measurements. In some embodiments, once a timestamp time shifted event for synchrophasor measurements is detected, the time error z can be estimated as set forth in EQ. (8) as follows $$\tau \approx \frac{\Delta A_{rel}}{2\pi \cdot \Delta f} \qquad (8)$$

The synchrophasor measurements obtained from the PMU 118a, 118b, and 118c may have their timestamps adjusted based on the determined error so as to improve synchronization with the actual reference clock signal, e.g., GPS clock, and/or other PMUs 118a, 118b, and 118c. These timestamp adjustments may be made on the synchrophasor measurements used to determine the error as well as future synchrophasor measurements received from the PMU 118a, 118b, and 118c until a new timestamp time shift detection analysis is performed to estimate a new error, e.g., timestamp time shift, value.

The alert module 345 may be configured to generate an alert or notification to the appropriate supervisory authority for the main power grid 102 by way of the DMS 114. The alert or notification may further trigger the automated or manual performance of an administrative operation on the power system. Such operations may include, but are not limited to, power system protection operations, power system fault location operations, power system oscillation detection operations, and power system event triangulation operations.

The data module 350 may represent the power system synchrophasor measurements from the PMUs 118a, 118b, and 118c and received by the PMU data collection module 325, the threshold used by the correlation analysis module 335, and other data structures used by the timestamp time shift detection module 320 for detecting synchrophasor measurement timestamp time shifts in a power system in accordance with some embodiments of the inventive concept.

The communication module 355 may be configured to facilitate communication between the DMS 114 processor and the PMUs 118a, 118b, and 118c of FIG. 1 over the network 120 and to facilitate communication of an alert or notification to the appropriate supervisory authority over one or more wired or wireless networks upon detection of a timestamp time shift event in the synchrophasor measurement data allowing for the option to correct the timestamp time shift error as described above with respect to the timestamp error estimation module 340. In some embodiments, the correction of the time shift errors in the synchrophasor data may be performed automatically in response to estimating the error.

Although FIG. 3 illustrates hardware/software architectures that may be used in data processing systems, such as the DMS 114 processor of FIG. 1 and the data processing system 200 of FIG. 2, respectively, for detecting synchrophasor measurement timestamp time shifts, in accordance with some embodiments of the inventive concept it will be understood that the present invention is not limited to such a configuration but is intended to encompass any configuration capable of carrying out operations described herein.

Computer program code for carrying out operations of data processing systems discussed above with respect to FIGS. 1-3 may be written in a high-level programming language, such as Python, Java, C, and/or C++, for development convenience. In addition, computer program code for carrying out operations of the present invention may also be written in other programming languages, such as, but not limited to, interpreted languages. Some modules or routines may be written in assembly language or even micro-code to enhance performance and/or memory usage. It will be further appreciated that the functionality of any or all of the program modules may also be implemented using discrete hardware components, one or more application specific integrated circuits (ASICs), or a programmed digital signal processor or microcontroller.

Moreover, the functionality of the DMS 114 processor of FIG. 1, the data processing system 200 of FIG. 2, and the hardware/software architecture of FIG. 3, may each be implemented as a single processor system, a multi-processor system, a multi-core processor system, or even a network of stand-alone computer systems, in accordance with various embodiments of the inventive concept. Each of these processor/computer systems may be referred to as a "processor" or "data processing system."

The data processing apparatus of FIGS. 1-3 may be used to facilitate the detection of synchrophasor measurement timestamp time shifts in a power system, according to various embodiments described herein. These apparatus may be embodied as one or more enterprise, application, personal, pervasive and/or embedded computer systems and/or apparatus that are operable to receive, transmit, process and store data using any suitable combination of software, firmware and/or hardware and that may be stand-alone or interconnected by any public and/or private, real and/or virtual, wired and/or wireless network including all or a portion of the global communication network known as the Internet, and may include various types of tangible, non-transitory computer readable media. In particular, the memory 206 coupled to the processor 208 and the memory 305 coupled to the processor 300 include computer readable program code that, when executed by the respective processors, causes the respective processors to perform operations including one or more of the operations described herein with respect to FIGS. 4-8, 9A-9C, 10A, and 10B.

Figure 4:
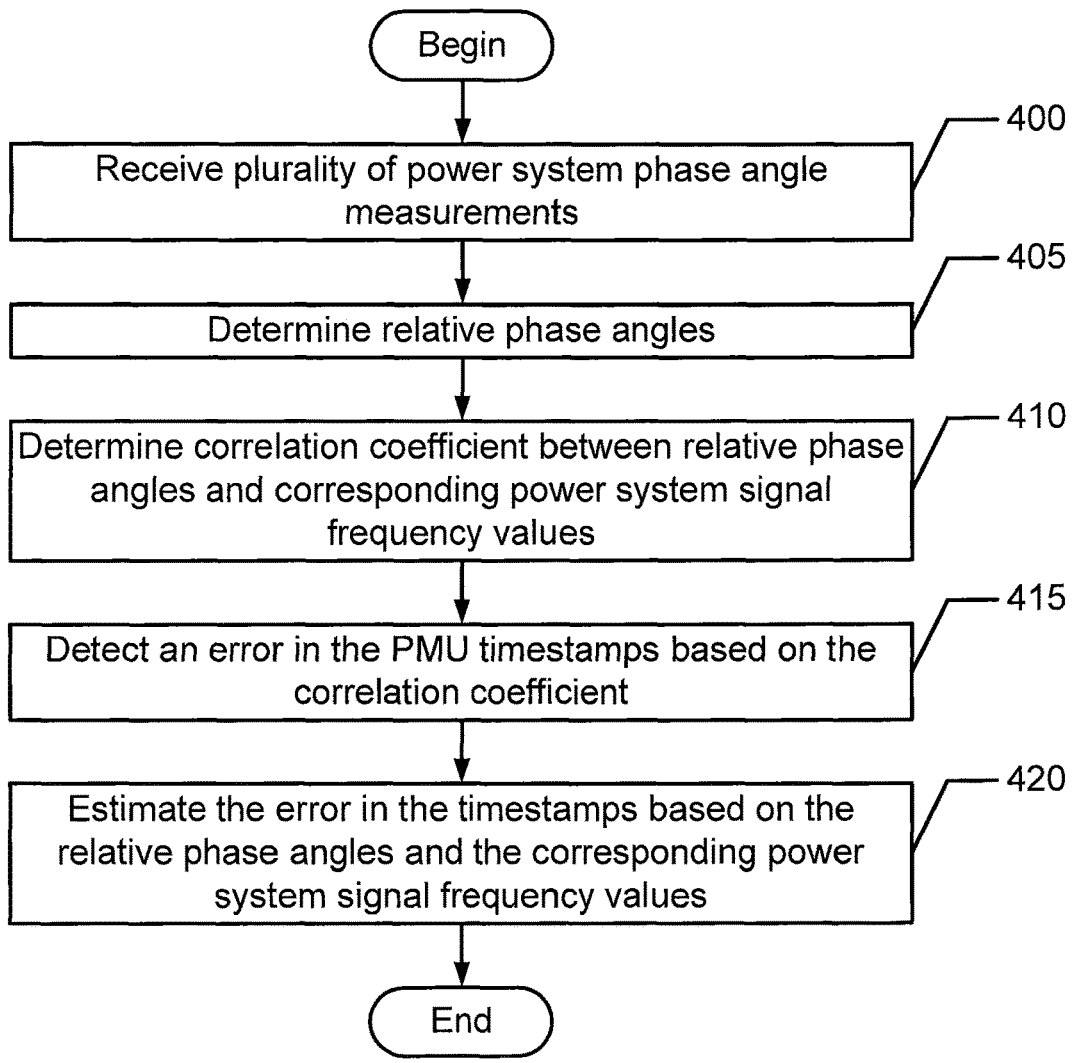
FIGS. 4-8 are flowcharts that illustrate operations for detecting synchrophasor measurement timestamp time shifts in a power system in accordance with some embodiments of the inventive concept.

FIG. 4 is a flowchart that illustrates operations for detecting synchrophasor measurement timestamp time shifts in a power system in accordance with some embodiments of the inventive concept. Operations begin at block 400 where the PMU data collection module 325 receives synchrophasor measurements where each of the synchrophasor measurements includes a phase angle, a frequency value, and a timestamp associated with the synchrophasor measurement from one of the PMUs 118a, 118b, and 118c. The measurements may correspond to a measurement collection time interval, which may be, in some embodiments, about 200 seconds in duration. It will be understood that while only three PMUs are illustrated in FIG. 1, fewer or more PMUs may be used in accordance with various embodiments of the inventive concept. At block 405, the relative phase angle generation module 330 determines the relative phase angles based on the phase angles included in the synchrophasor measurements. In some embodiments, the relative phase angles may be determined by subtracting a reference phase angle or a phase angle of a reference PMU, which, in some embodiments, may be a power system average phase angle, from the phase angles included in the synchrophasor measurements. The correlation analysis module 335 quantifies a similarity between the relative phase angles and the corresponding frequency values of the power system signal at block 410 by determining a correlation coefficient between the relative phase angles and the corresponding frequency values. The timestamp error estimation module 340 detects an error, i.e., a time shift, in the timestamps of the PMU synchrophasor measurements at block 415 based on the correlation coefficient. For example, in some embodiments, when the correlation coefficients exceeds a defined threshold where the greater the coefficient value, the higher the correlation, then the timestamp error estimation module 340 detects a time shift error in the synchrophasor timestamps. Otherwise, the correlation may be deemed to be insufficient to indicate a time shift error in the synchrophasor measurements. The timestamp error estimation module 340 estimates the error based on the relative phase angles and the corresponding frequency values of the power system signal at block 420.

Figure 5:
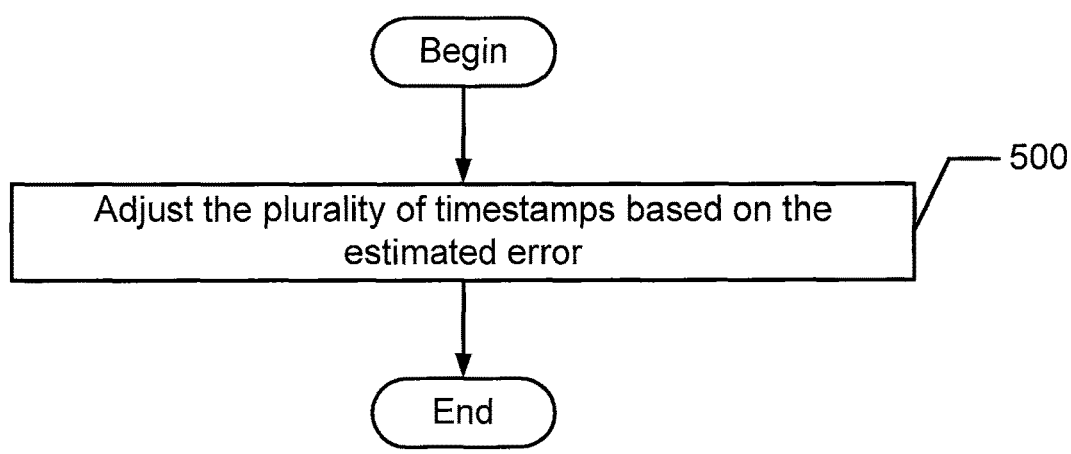

FIG. 5 is a flowchart that illustrates further operations for detecting synchrophasor measurement timestamp time shifts in a power system in accordance with some embodiments of the inventive concept. Operations begin at block 500 where the timestamp error estimation module 340 adjusts the plurality of timestamps based on the estimated error. These timestamp adjustments may be made on the synchrophasor measurements used to determine the error and/or future synchrophasor measurements received from the PMU 118a, 118b, and 118c until a new timestamp time shift detection analysis is performed to estimate a new error, e.g., timestamp time shift, value.

Figure 6:
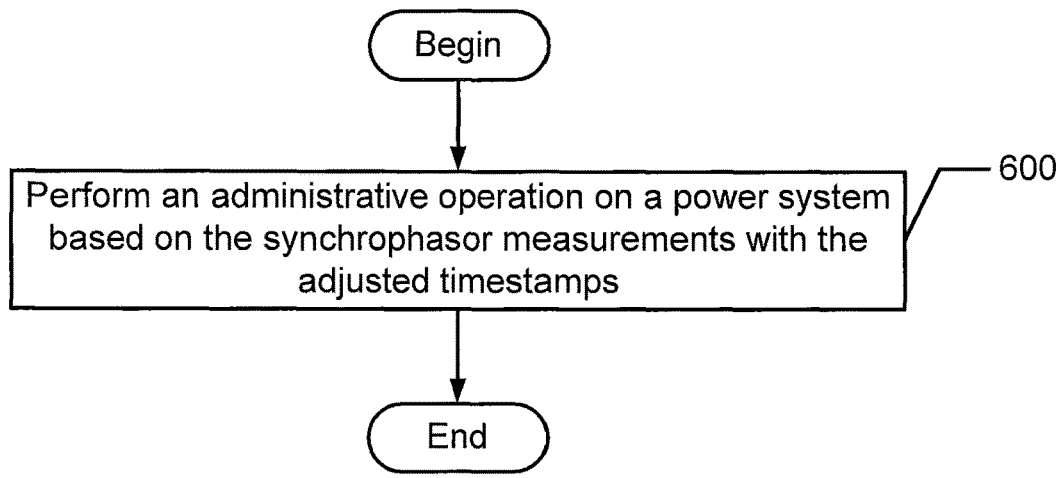

FIG. 6 is a flowchart that illustrates further operations for detecting synchrophasor measurement timestamp time shifts in a power system in accordance with some embodiments of the inventive concept. Operations begin at block 600 where the alert module 345 may trigger the automated or manual performance of an administrative operation on the power system based on the synchrophasor measurements with the adjusted, i.e., error corrected, timestamps. Such operations may include, but are not limited to, power system protection operations, power system fault location operations, power system oscillation detection operations, and power system event triangulation operations.

Figure 7:
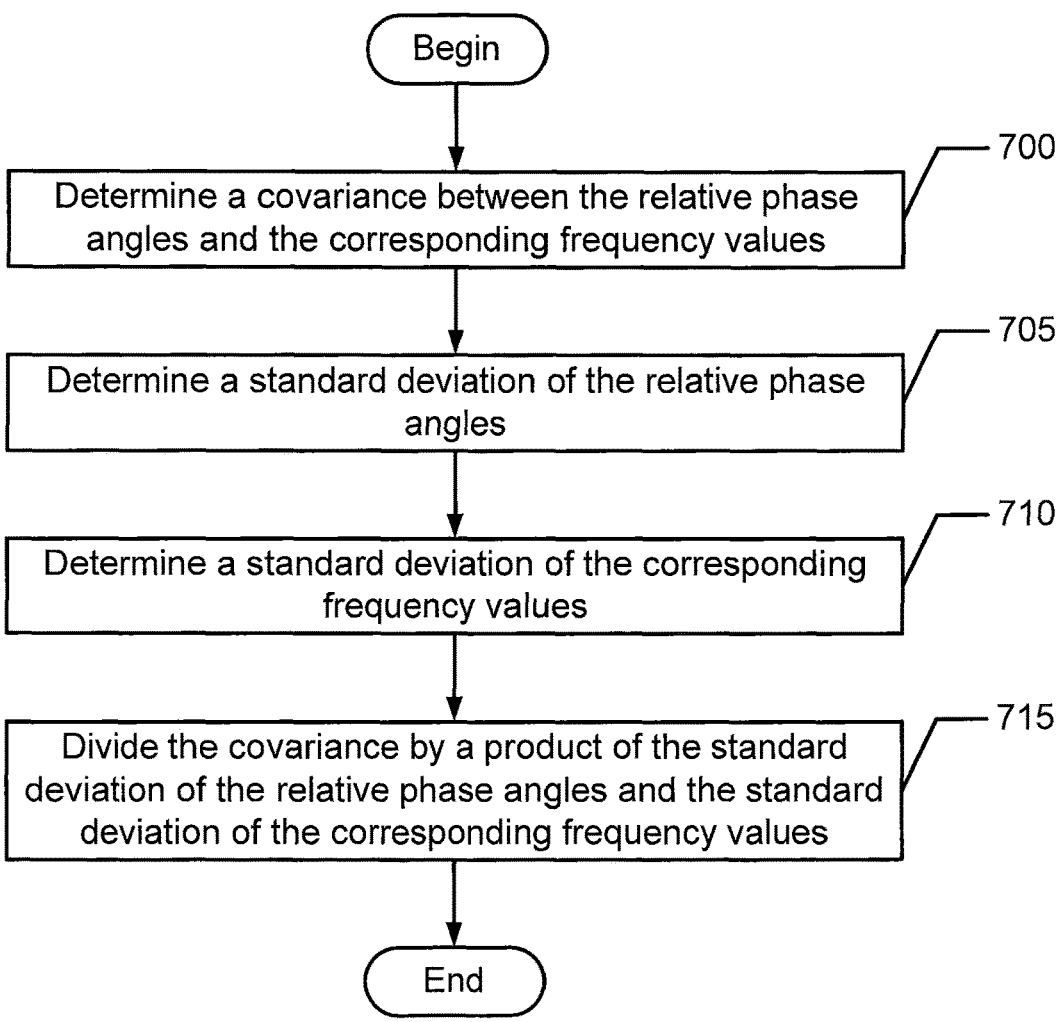

FIG. 7 is a flowchart that illustrates further operations of block 415 of FIG. 4 for determining the correlations coefficient according to some embodiments of the inventive concept. Operations begin at block 700 where a covariance is determined between the relative phase angles of the synchrophasor measurements and the corresponding frequency values. A standard deviation of the relative phase angles is determined at block 705 and a standard deviation of the corresponding frequency values is determined at block 710. The covariance is divided by a product of the standard deviation of the relative phase angles and the standard deviation of the corresponding frequency values at block 715. Thus, the operations of blocks 700, 705, 710, and 715 may be used to determine a correlation coefficient as set forth above in EQ. 7 in accordance with some embodiments of the inventive concept.

Figure 8:
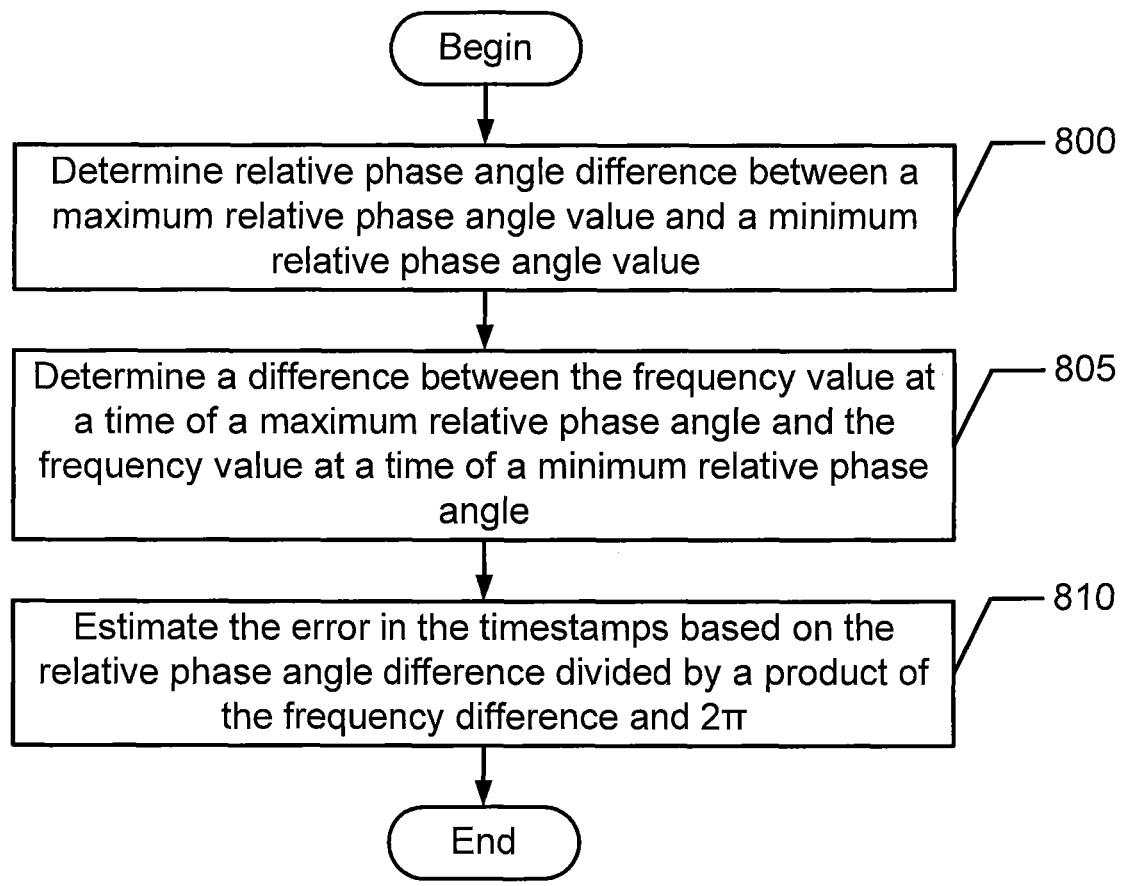

FIG. 8 is a flowchart that illustrates further operations of block 420 of FIG. 4 for estimating the error in the timestamps of the synchrophasor measurements obtained from one of the PMUs 118a, 118b, and 118c. Operations begin at block 800 where a difference between a maximum relative phase angle value and a minimum relative phase angle value is determined as the relative phase angle difference. At block 805 a difference between the frequency value at a time of a maximum relative phase angle and the frequency value at a time of a minimum relative phase angle is determined as the frequency difference. The error is estimated at block 810 based on the relative phase angle difference divided by a product of the frequency difference and $2\pi$. Thus, the operations at blocks 800, 805, and 810 may be used to determine the synchrophasor timestamp time shift error as set forth above in EQ. 8 in accordance with some embodiments of the inventive concept.

The operations of FIG. 4 and FIG. 8 may be performed multiple times for different time intervals to determine the correlation coefficient for each time interval as well as determining the maximum and minimum relative phase angle values and frequency values at the maximum and minimum relative phase angles for estimating the time shift error. The correlation coefficients for the respective time intervals may be averaged for comparing to the correlation threshold, for example, in block 415. If the average correlation coefficient exceeds the threshold as described above, then a time shift error in the synchrophasor timestamps may be detected. The error may be estimated as described above with respect to FIG. 8 where the difference between the maximum and minimum phase angle values and the difference between the frequency values at the maximum and minimum phase angles may be determined over the multiple time intervals over which synchrophasor measurements were collected.

Figure 9A:
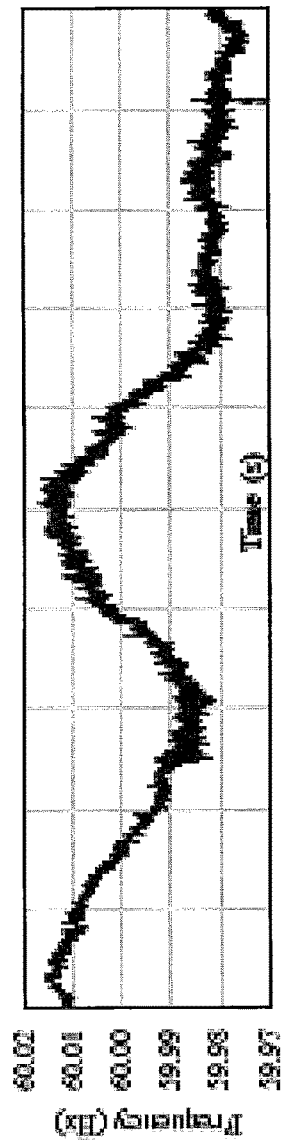
FIGS. 9A-9C are graphical representations illustrating the correlation between relative phase angle and frequency when synchrophasor measurements are timestamp time shifted in accordance with some embodiments of the inventive concept.
Figure 9B:
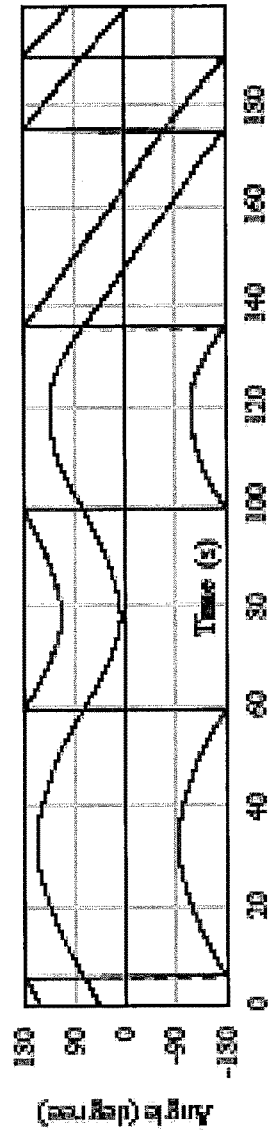
Figure 9C:
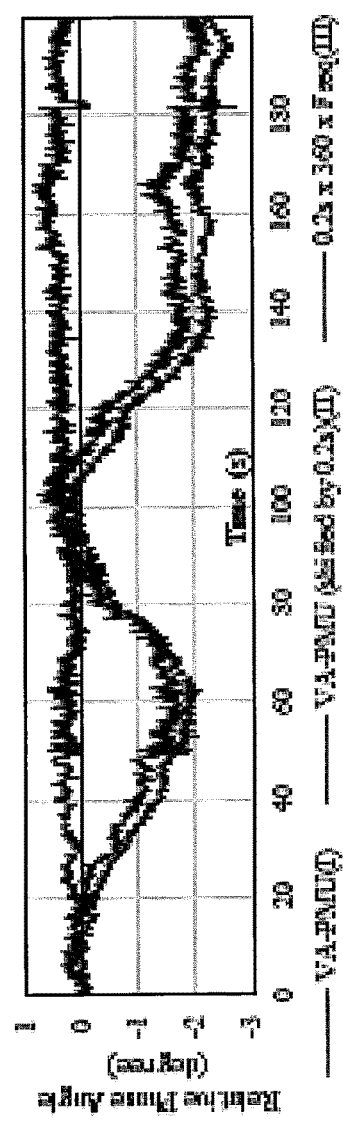
Figure 10A:
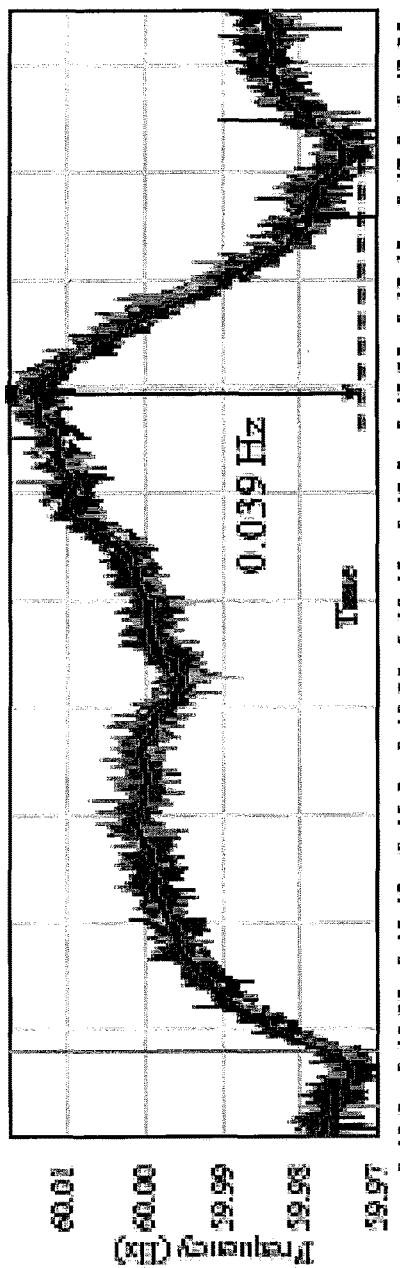
FIGS. 10A and 10B are graphical representations illustrating the correlation between relative phase angle and frequency when synchrophasor measurements are timestamped shifted based on experimental data obtained from a power system.
Figure 10B:
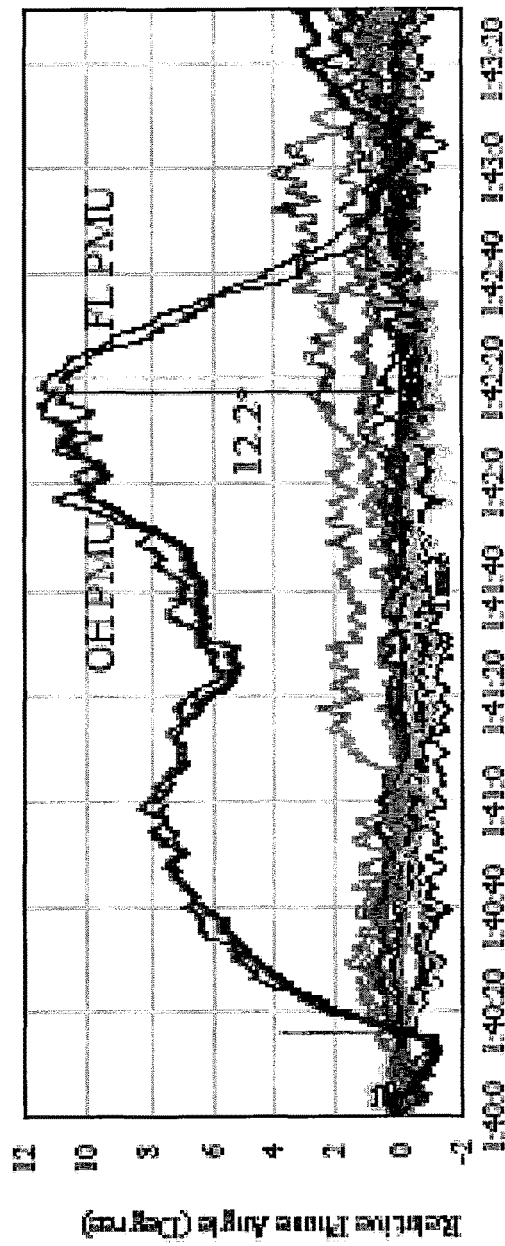

Embodiments of the inventive concept may be illustrated by way of example. FIGS. 9A-9C are graphical illustrations that illustrate the correlation between relative phase angle and frequency when synchrophasor measurements are timestamp time shifted in a simulated environment and FIGS. 10A and 10B are graphical representations illustrating the correlation between relative phase angle and frequency when synchrophasor measurements are timestamped time shifted based on experimental data obtained from a power system in accordance with some embodiments of the inventive concept. In both the simulated timestamp time shift case study and the actual timestamp time shift case study, the synchrophasor measurements were obtained from FNET/Grideye using a correlation coefficient threshold ε of 0.95.

Simulated Synchrophasor Timestamp Time Shift Case Study

In this case study, a set of ambient data in a 200-second time window, which consists of system frequency, system angle and measured frequency from a PMU at Virginia (VA), are used for timestamp time shift detection. A simulated data series is also added, which is generated by shifting the time of the VA PMU by 0.2 seconds. The frequency and phase angle data is shown in FIGS. 9A and 9B, respectively, from which the timestamp time shift may be difficult to determine. For comparison, the relative phase angle of the original PMU data and time-shifted data of this VA PMU are calculated and plotted in FIG. 9C. A self-normalized series, which is linear to the frequency of VA PMU, is added to FIG. 9C as a curve (III) which equals to 0.2 s×360°×f(T). The curve (I) in FIG. 9C shows that the normal relative phase angle varies within 1° during the time window while curve (II) of the time-shifted relative phase angle has significant similarity with its frequency. The correlation coefficient of the frequency values and time-shifted relative phase angle values is 0.967, which exceeds the threshold for recognizing a time shift error in the PMU synchrophasor measurements. It can be observed that the relative angle of time-shifted VA PMU (curve II) approximates to the summation of the raw relative angle (curve I) and the frequency-linear portion (curve III), which verifies EQ. (6).

Actual Synchrophasor Timestamp Time Shift Case Study

The FNET/Grideye system has more than 100 PMUs deployed in the Eastern Interconnection (EI). Two of these units, which are located in Florida (FL) and Ohio (OH), have a known timestamp time shift error of around 0.9 seconds. An arbitrary 3-minute time window of ambient data is chosen in this study case to detect and calculate the time shift in the synchrophasor timestamps.

To reduce the impact of local disturbance of individual PMUs, the system phase angle is leveraged as the phase angle reference based on which, the relative phase angles of all PMUs are calculated. The frequency and relative phase angle of 20 units are plotted in FIG. 10A to demonstrate the result.

Under normal operating conditions, the relative phase angles of all units stochastically vary within ±4°, as shown in FIG. 10B. However, the relative phase angles of FL and OH units show much larger variation and significant similarity with frequency. The correlation coefficients of the two PMUs' relative angle with measured frequency are 0.975 and 0.983, respectively, which strongly indicates a time shift in the timestamped synchrophasor measurements. During the 3-minute time window, the maximum frequency deviation is 0.039 Hz, and corresponding relative phase angle deviation is 12.2°. According to EQ. (8), the estimated timestamp time shift is 0.87 seconds, corresponding to the known error.

Embodiments of the inventive concept may provide a methodology for detecting a time shift in the timestamps associated with synchrophasor data provided by a PMU. Embodiments of the inventive concept may arise from the realization that for time shifted synchrophasor measurements, the relative phase angle and the corresponding frequency may be correlated, e.g., by a linear relationship, and this correlation may be detected and used as an indicator that the synchrophasor data includes a time shift error. The computational complexity of the methodology may be relatively low, which may facilitate implementation as part of a DMS including a phasor data concentrator module. Experiments, both simulated and actual, demonstrate the effectiveness of the embodiments for detecting synchrophasor measurement timestamp time shifts in a power system in accordance with some embodiments of the inventive concept.

Further Definitions and Embodiments

In the above-description of various embodiments of the present disclosure, aspects of the present disclosure may be illustrated and described herein in any of a number of patentable classes or contexts including any new and useful process, machine, manufacture, or composition of matter, or any new and useful improvement thereof. Accordingly, aspects of the present disclosure may be implemented entirely hardware, entirely software (including firmware, resident software, micro-code, etc.) or combining software and hardware implementation that may all generally be referred to herein as a "circuit," "module," "component," or "system." Furthermore, aspects of the present disclosure may take the form of a computer program product comprising one or more computer readable media having computer readable program code embodied thereon.

Any combination of one or more computer readable media may be used. The computer readable media may be a computer readable signal medium or a computer readable storage medium. A computer readable storage medium may be, for example, but not limited to, an electronic, magnetic, optical, electromagnetic, or semiconductor system, apparatus, or device, or any suitable combination of the foregoing. More specific examples (a non-exhaustive list) of the computer readable storage medium would include the following: a portable computer diskette, a hard disk, a random access memory (RAM), a read-only memory (ROM), an erasable programmable read-only memory (EPROM or Flash memory), an appropriate optical fiber with a repeater, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device. Program code embodied on a computer readable signal medium may be transmitted using any appropriate medium, including but not limited to wireless, wireline, optical fiber cable, RF, etc., or any suitable combination of the foregoing.

Computer program code for carrying out operations for aspects of the present disclosure may be written in any combination of one or more programming languages, including an object oriented programming language such as Java, Scala, Smalltalk, Eiffel, JADE, Emerald, C++, C#, VB.NET, Python or the like, conventional procedural programming languages, such as the "C" programming language, Visual Basic, Fortran 2003, Perl, COBOL 2002, PHP, ABAP, LabVIEW, dynamic programming languages, such as Python, Ruby and Groovy, or other programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider) or in a cloud computing environment or offered as a service such as a Software as a Service (SaaS).

Aspects of the present disclosure are described herein with reference to flowchart illustrations and/or block diagrams of methods, apparatus (systems), and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable instruction execution apparatus, create a mechanism for implementing the functions/acts specified in the flowchart and/or block diagram block or blocks.

These computer program instructions may also be stored in a computer readable medium that when executed can direct a computer, other programmable data processing apparatus, or other devices to function in a particular manner, such that the instructions when stored in the computer readable medium produce an article of manufacture including instructions which when executed, cause a computer to implement the function/act specified in the flowchart and/or block diagram block or blocks. The computer program instructions may also be loaded onto a computer, other programmable instruction execution apparatus, or other devices to cause a series of operational steps to be performed on the computer, other programmable apparatuses or other devices to produce a computer implemented process such that the instructions which execute on the computer or other programmable apparatus provide processes for implementing the functions/acts specified in the flowchart and/or block diagram block or blocks.

The flowchart and block diagrams in the figures illustrate the architecture, functionality, and operation of possible implementations of systems, methods, and computer program products according to various aspects of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The present disclosure of embodiments has been presented for purposes of illustration and description, but is not intended to be exhaustive or limited to the disclosure in the form disclosed. Many variations and modifications can be made to the embodiments without substantially departing from the principles of the present invention. All such variations and modifications are intended to be included herein within the scope of the present invention.

What is claimed is:

1. A method comprising:
    performing by a processor:
    receiving a plurality of synchrophasor measurements of a power system signal associated with a time interval from a phasor measurement unit (PMU), each of the plurality of synchrophasor measurements including a phase angle, frequency value, and a timestamp associated with the synchrophasor measurement;
    determining a plurality of relative phase angles based on the plurality of phase angles;
    determining a correlation coefficient between the plurality of relative phase angles and a plurality of corresponding frequency values of the power system signal;
    detecting an error in the plurality of timestamps based on the correlation coefficient;
    estimating the error in the plurality of timestamps based on the plurality of relative phase angles and the plurality of corresponding frequency values;
    adjusting the plurality of timestamps of the plurality of synchrophasor measurements received from the PMU based on the error; and
    performing an administrative operation on the power system based on the plurality of synchrophasor measurements having the plurality of timestamps, respectively, that have been adjusted responsive to the synchrophasor measurements indicating a change in a nominal frequency of the power system signal;
    wherein the administration operation comprises a power system protection operation, a power system fault location operation, a power system oscillation detection operation, or a power system event triangulation operation.

2. The method of claim 1, wherein the plurality of synchrophasor measurements is a first plurality of synchrophasor measurements, the plurality of phase angles is a first plurality of phase angles, the plurality of timestamps is a first plurality of timestamps, and the time interval is a first time interval, the method further comprising:
    receiving a second plurality of synchrophasor measurements of the power system signal associated with a second time interval from the PMU, each of the second plurality of synchrophasor measurements including a second phase angle and a second timestamp associated with the synchrophasor measurement; and
    adjusting the second plurality of timestamps associated with the second plurality of synchrophasor measurements received from the PMU based on the error.

3. The method of claim 1, wherein determining the plurality of relative phase angles based on the plurality of phase angles comprises:
    subtracting a power system average phase angle or a phase angle of a reference PMU from each of the plurality of phase angles to obtain the plurality of relative phase angles.

4. The method of claim 1, wherein determining the correlation coefficient between the plurality of relative phase angles and the plurality of corresponding frequency values of the power system signal comprises:
    determining a covariance between the plurality of relative phase angles and the plurality of corresponding frequency values;
    determining a standard deviation of the plurality of relative phase angles;
    determining a standard deviation of the plurality of corresponding frequency values; and
    dividing the covariance by a product of the standard deviation of the plurality of relative phase angles and the standard deviation of the plurality of corresponding frequency values.

5. The method of claim 1, wherein detecting the error in the plurality of timestamps based on the correlation coefficient comprises:
    comparing the correlation coefficient to a threshold; and
    detecting the error in the plurality of timestamps based on a difference between the correlation coefficient and the threshold.

6. The method of claim 1, wherein estimating the error in the plurality of timestamps based on the plurality of relative phase angles and the plurality of corresponding frequency values comprises:
    determining a relative phase angle difference between a maximum relative phase angle value of the plurality of relative phase angles and a minimum relative phase angle value of the plurality of relative phase angles;
    determining a frequency difference between the frequency value at a time of a maximum relative phase angle and the frequency value at a time of a minimum relative phase angle; and
    estimating the error in the plurality of timestamps based on the relative phase angle difference divided by a product of the frequency difference and $2\pi$.

7. The method of claim 1, wherein the plurality of synchrophasor measurements is a first plurality of synchrophasor measurements, the plurality of phase angles is a first plurality of phase angles, the plurality of timestamps is a first plurality of timestamps, the time interval is a first time interval, the plurality of relative phase angles is a first plurality of relative phase angles, and the correlation coefficient is a first correlation coefficient, the method further comprising:
 receiving a second plurality of synchrophasor measurements of the power system signal associated with a second time interval from the PMU, each of the second plurality of synchrophasor measurements including a second phase angle and a second timestamp associated with the synchrophasor measurement;
 determining a second plurality of relative phase angles based on the second plurality of phase angles;
 determining a second correlation coefficient between the second plurality of relative phase angles and a second plurality of corresponding frequency values of the power system signal; and
 determining an average of the first correlation coefficient and the second correlation coefficient.

8. The method of claim 7, wherein detecting the error in the first plurality of timestamps based on the correlation coefficient comprises:
 detecting the error in the first plurality of timestamps and the second plurality of timestamps based on the average of the first correlation coefficient and the second correlation coefficient; and
 wherein estimating the error in the first plurality of timestamps based on the first plurality of relative phase angles and the first plurality of corresponding frequency values comprises:
 estimating the error in the first plurality of timestamps and the second plurality of timestamps based on the first plurality of relative phase angles, the second plurality of relative phase angles, the first plurality of corresponding frequency values, and the second plurality of corresponding frequency values.

9. A system, comprising:
 a processor; and
 a memory coupled to the processor and comprising computer readable program code embodied in the memory that is executable by the processor to perform operations comprising:
 receiving a plurality of synchrophasor measurements of a power system signal associated with a time interval from a phasor measurement unit (PMU), each of the plurality of synchrophasor measurements including a phase angle, frequency value, and a timestamp associated with the synchrophasor measurement;
 determining a plurality of relative phase angles based on the plurality of phase angles;
 determining a correlation coefficient between the plurality of relative phase angles and a plurality of corresponding frequency values of the power system signal;
 detecting an error in the plurality of timestamps based on the correlation coefficient;
 estimating the error in the plurality of timestamps based on the plurality of relative phase angles and the plurality of corresponding frequency values;
 adjusting the plurality of timestamps of the plurality of synchrophasor measurements received from the PMU based on the error; and
 performing an administration operation on the power system based on the plurality of synchrophasor measurements having the plurality of timestamps, respectively, that have been adjusted responsive to the synchrophasor measurements indicating a change in a nominal frequency of the power system signal;
 wherein the administration operation comprises a power system protection operation, a power system fault location operation, a power system oscillation detection operation, or a power system event triangulation operation.

10. The system of claim 9, wherein determining the correlation coefficient between the plurality of relative phase angles and the plurality of corresponding frequency values of the power system signal comprises:
 determining a covariance between the plurality of relative phase angles and the plurality of corresponding frequency values;
 determining a standard deviation of the plurality of relative phase angles;
 determining a standard deviation of the plurality of corresponding frequency values; and
 dividing the covariance by a product of the standard deviation of the plurality of relative phase angles and the standard deviation of the plurality of corresponding frequency values.

11. The system of claim 9, wherein detecting the error in the plurality of timestamps based on the correlation coefficient comprises:
 comparing the correlation coefficient to a threshold; and
 detecting the error in the plurality of timestamps based on a difference between the correlation coefficient and the threshold.

12. The system of claim 9, wherein estimating the error in the plurality of timestamps based on the plurality of relative phase angles and the plurality of corresponding frequency values comprises:
 determining a relative phase angle difference between a maximum relative phase angle value of the plurality of relative phase angles and a minimum relative phase angle value of the plurality of relative phase angles;
 determining a frequency difference between the frequency value at a time of a maximum relative phase angle and the frequency value at a time of a minimum relative phase angle; and
 estimating the error in the plurality of timestamps based on the relative phase angle difference divided by a product of the frequency difference and $2\pi$.

13. A computer program product, comprising:
 a non-transitory computer readable storage medium comprising computer readable program code embodied in the medium that is executable by a processor to perform operations comprising:
 receiving a plurality of synchrophasor measurements of a power system signal associated with a time interval from a phasor measurement unit (PMU), each of the plurality of synchrophasor measurements including a phase angle, frequency value, and a timestamp associated with the synchrophasor measurement;
 determining a plurality of relative phase angles based on the plurality of phase angles;
 determining a correlation coefficient between the plurality of relative phase angles and a plurality of corresponding frequency values of the power system signal;
 detecting an error in the plurality of timestamps based on the correlation coefficient;
 estimating the error in the plurality of timestamps based on the plurality of relative phase angles and the plurality of corresponding frequency values;

adjusting the plurality of timestamps of the plurality of synchrophasor measurements received from the PMU based on the error; and performing an administrative operation on the power system based on the plurality of synchrophasor measurements having the plurality of timestamps, respectively, that have been adjusted responsive to the synchrophasor measurements indicating a change in a nominal frequency of the power system signal;

wherein the administration operation comprises a power system protection operation, a power system fault location operation, a power system oscillation detection operation, or a power system event triangulation operation.

14. The computer program product of claim 13, wherein determining the correlation coefficient between the plurality of relative phase angles and the plurality of corresponding frequency values of the power system signal comprises:

determining a covariance between the plurality of relative phase angles and the plurality of corresponding frequency values;

determining a standard deviation of the plurality of relative phase angles;

determining a standard deviation of the plurality of corresponding frequency values; and dividing the covariance by a product of the standard deviation of the plurality of relative phase angles and the standard deviation of the plurality of corresponding frequency values.

15. The computer program product of claim 13, wherein detecting the error in the plurality of timestamps based on the correlation coefficient comprises:

comparing the correlation coefficient to a threshold; and detecting the error in the plurality of timestamps based on a difference between the correlation coefficient and the threshold.

16. The computer program product of claim 13, wherein estimating the error in the plurality of timestamps based on the plurality of relative phase angles and the plurality of corresponding frequency values comprises:

determining a relative phase angle difference between a maximum relative phase angle value of the plurality of relative phase angles and a minimum relative phase angle value of the plurality of relative phase angles;

determining a frequency difference between the frequency value at a time of a maximum relative phase angle and the frequency value at a time of a minimum relative phase angle; and estimating the error in the plurality of timestamps based on the relative phase angle difference divided by a product of the frequency difference and $2\pi$.

* * * * *

UNITED STATES PATENT AND TRADEMARK OFFICE
CERTIFICATE OF CORRECTION

PATENT NO. : 11,209,469 B2
APPLICATION NO. : 16/418540
DATED : December 28, 2021
INVENTOR(S) : Liu et al.

It is certified that error appears in the above-identified patent and that said Letters Patent is hereby corrected as shown below:

In the Specification

Column 10, Line 16: Please correct "$= \Delta A_{ref}(T) + 2\pi \cdot \Delta f_\tau(T) \cdot \Delta t$" to read -- $= \Delta A_{rel}(T) + 2\pi \cdot \Delta f_\tau(T) \cdot \Delta t$ --

Signed and Sealed this
Fifth Day of July, 2022

Katherine Kelly Vidal
*Director of the United States Patent and Trademark Office*